(12) United States Patent
Pfirsch

(10) Patent No.: US 6,878,997 B2
(45) Date of Patent: Apr. 12, 2005

(54) COMPENSATION COMPONENT AND METHOD FOR FABRICATING THE COMPONENT

(75) Inventor: Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/675,758

(22) Filed: Sep. 30, 2003

(65) Prior Publication Data

US 2004/0067625 A1 Apr. 8, 2004

(30) Foreign Application Priority Data

Sep. 30, 2002 (DE) .......................................... 102 45 550

(51) Int. Cl.[7] .............................................. H01L 29/76
(52) U.S. Cl. ...................... 257/341; 257/262; 257/328; 257/335; 257/653
(58) Field of Search ................................ 257/328, 335, 257/341, 262, 653

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,438,215 A * | 8/1995 | Tihanyi | 257/401 |
| 6,081,009 A * | 6/2000 | Neilson | 257/341 |
| 6,294,818 B1 * | 9/2001 | Fujihira | 257/409 |
| 6,465,869 B1 | 10/2002 | Ahlers et al. | |
| 6,734,462 B1 * | 5/2004 | Shah | 257/77 |
| 6,768,169 B1 * | 7/2004 | Tihanyi | 257/341 |
| 6,768,171 B1 * | 7/2004 | Disney | 257/342 |
| 2001/0048144 A1 | 12/2001 | Ahlers et al. | |

FOREIGN PATENT DOCUMENTS

DE     100 26 924 A1     12/2001

\* cited by examiner

*Primary Examiner*—Michael S. Lebentritt
*Assistant Examiner*—Douglas Menz
(74) *Attorney, Agent, or Firm*—Lawrence A. Greenberg; Werner H. Stemer; Gregory L. Stemer

(57) ABSTRACT

A compensation component, in which a lateral section and, at least at one end of the lateral section, a section that is inclined with respect to the surface of a drift path, includes n-conducting and p-conducting regions completely embedded in a semiconductor body without a trench. In such a case, the inclined section is formed by ion implantation through an implantation mask with an inclined edge.

14 Claims, 8 Drawing Sheets

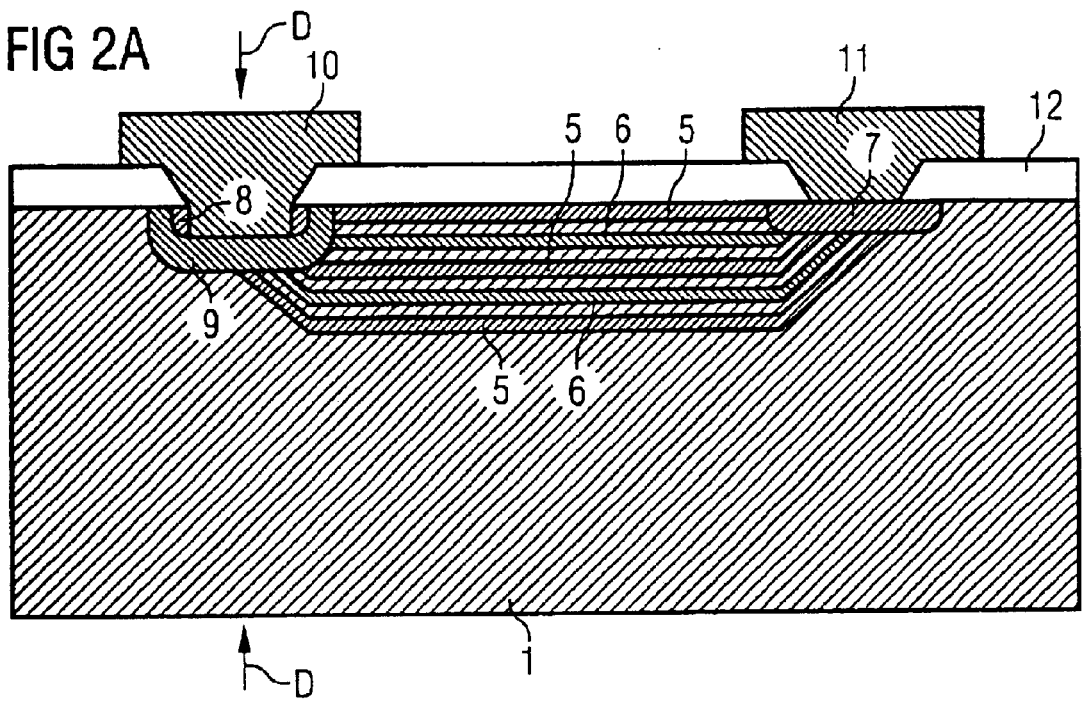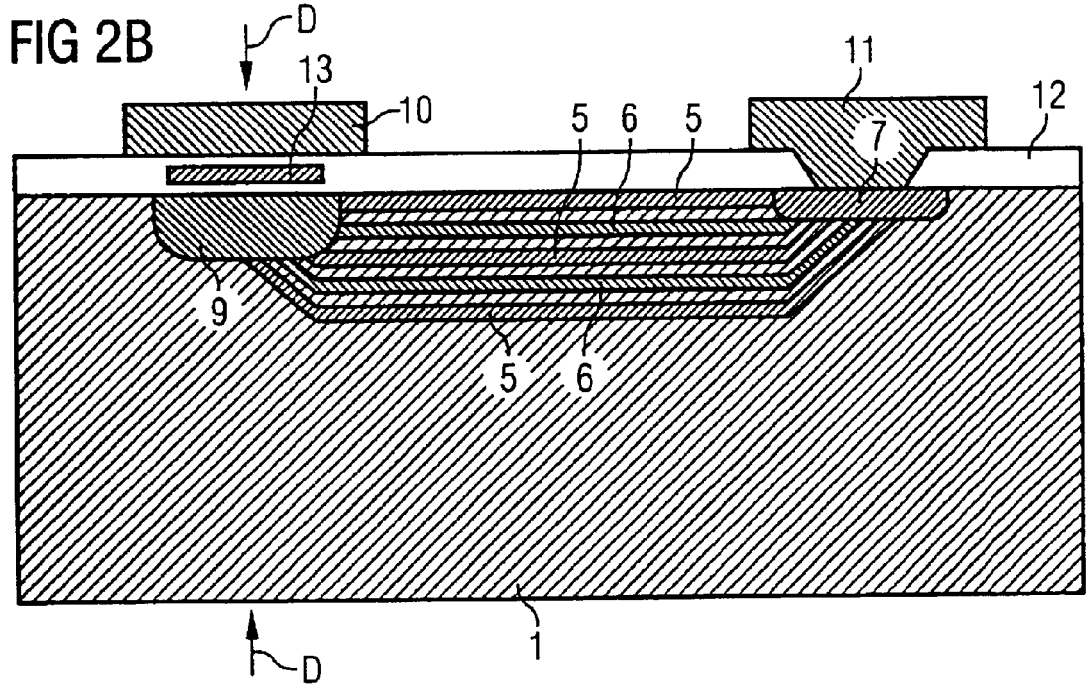

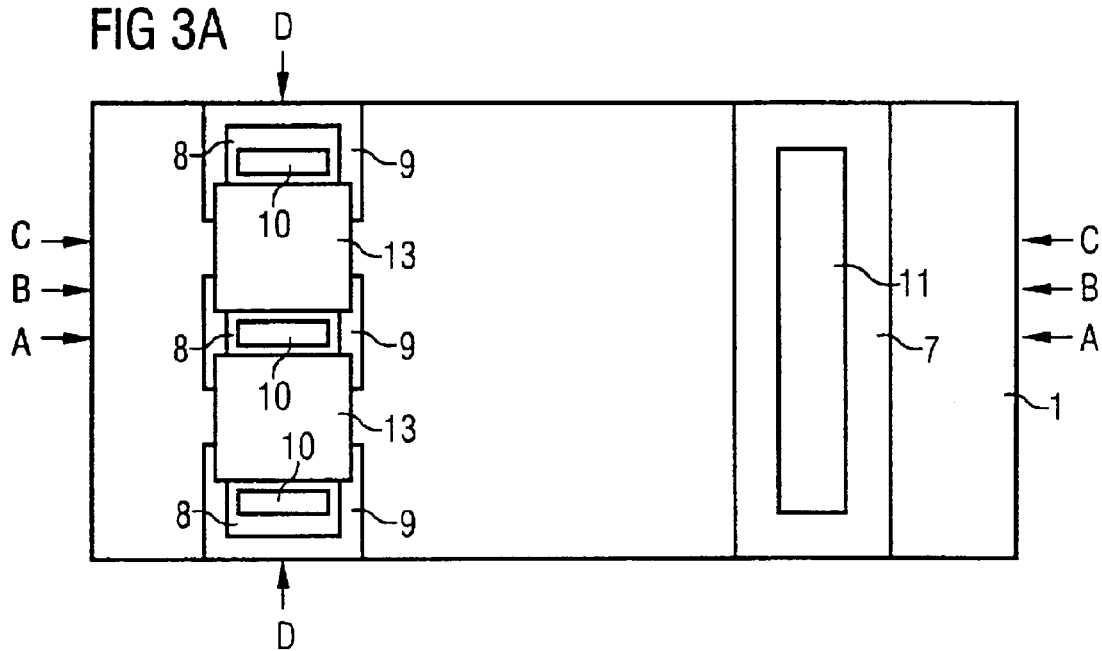
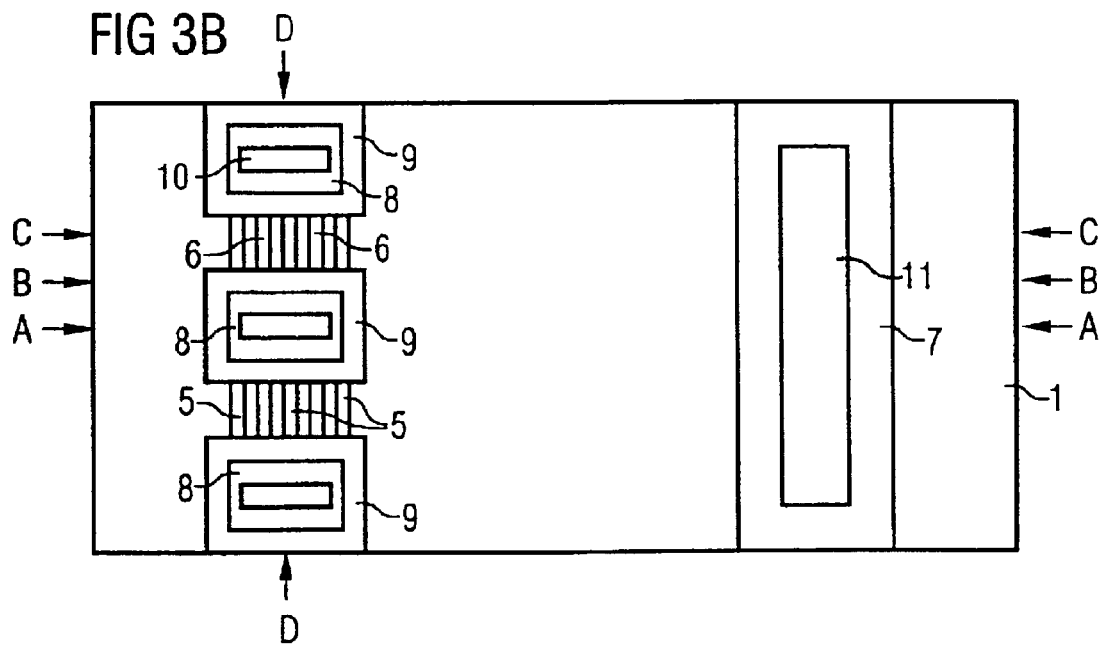

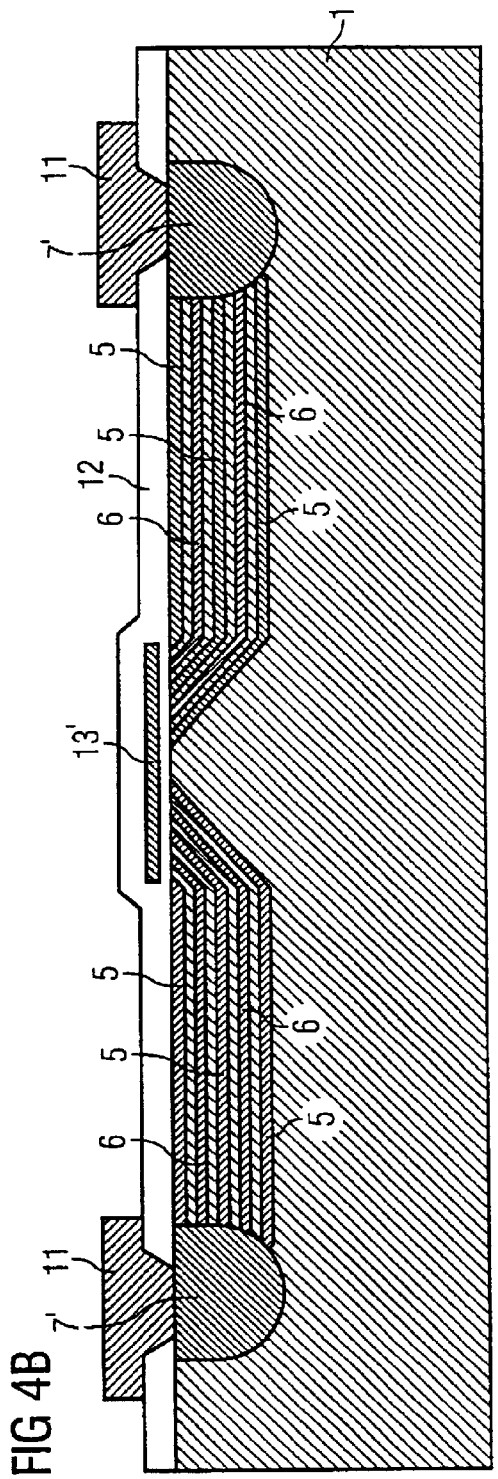
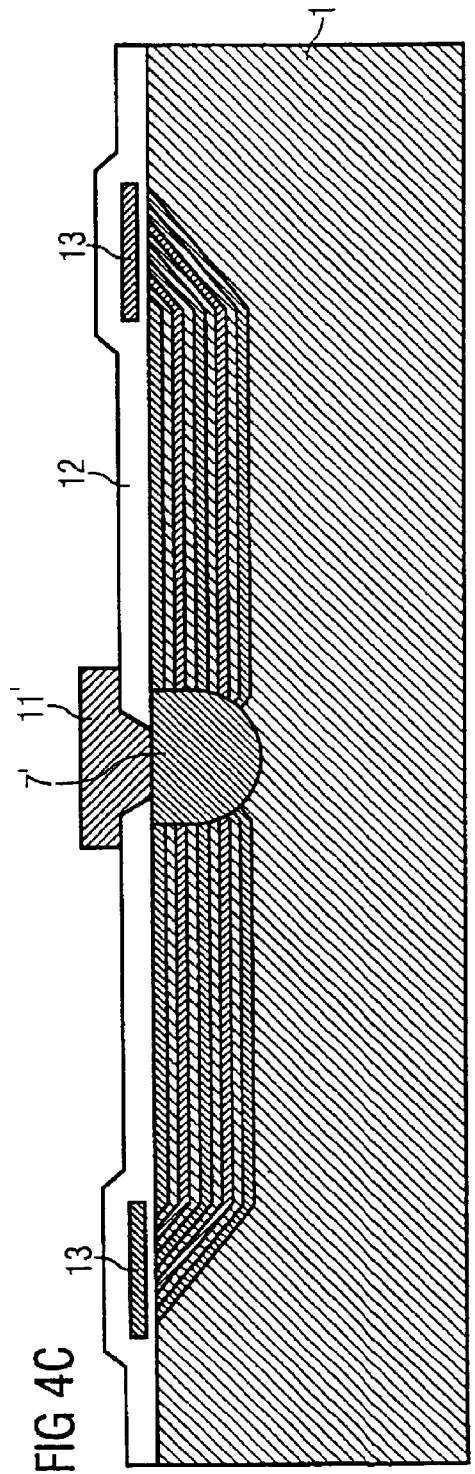
FIG 4B
FIG 4C

COMPENSATION COMPONENT AND METHOD FOR FABRICATING THE COMPONENT

BACKGROUND OF THE INVENTION

Field of the Invention

The present invention relates to a compensation component having a drift path provided between two active zones in a semiconductor body and including a stacked layer sequence made up of regions of one conduction type and the other conduction type, which have a lateral section and at least one inclined section that leads toward the surface of the semiconductor body and adjoins one end of the lateral section. The invention also relates to a method for fabricating a compensation component of this type.

In compensation components, the n-conducting and p-conducting regions disposed in the direction in which current flows in the drift path are so highly doped that in the off state the entire drift path is devoid of charges. In the on state, however, the n-conducting and p-conducting regions make a significantly higher contribution to the flow of current than do regions of one conduction type, i.e., n-conducting regions, in conventional components. Therefore, compensation components have a low on resistance Ron combined with a high locking capacity.

It is now known that compensation components can be configured both as vertical components (cf. in this respect U.S. Pat. No. 5,216,275 to Chen) and as lateral components (cf. in this respect U.S. Pat. No. 4,754,310 to Coe). In the case of vertical components, by way of example, a source electrode and a gate electrode are located on an upper side of a semiconductor body, while a drain electrode is applied to the underside, which is located on the opposite side from this upper side, of the semiconductor body. The compensation regions are, in this case, n-conducting and p-conducting layers, also referred to as columns, which, alternating with one another in the interior of the semiconductor body, extend in the direction between source and drain.

In the case of lateral components, two V-shaped trenches can be introduced into a semiconductor body, of which one trench accommodates the source electrode and the gate electrode while the other trench is intended for the drain electrode. The compensation regions are, in this case, provided as n-conducting and p-conducting layers that are positioned on top of one another and alternate with one another in the region of the semiconductor body between the two trenches.

Compensation components with vertical structures and compensation components with lateral structures each have their advantages and disadvantages for the fabrication of such components: in the case of vertical structures, the source electrode and the drain electrode can be fabricated considerably more easily on the opposite surfaces of the semiconductor body than source electrode and drain electrode in lateral structures. However, in the case of vertical structures, the production of the drift path that receives the reverse voltage from alternating n-conducting and p-conducting regions that extend in the vertical direction by building them up by multiple epitaxy in each case followed by ion implantation and diffusion, for example, using the technology known as CoolMOS, is relatively complex. On the other hand, in the case of lateral structures, the alternating n-conducting and p-conducting regions can be produced much more easily compared to the technology required to build up the vertical structures by successively applying n-conducting and p-conducting layers to a semiconductor wafer by epitaxy. If appropriate, doping by implantation can also be used instead of epitaxy. However, problems with lateral structures are the terminals for source and drain because the layers that form the compensation regions have to be connected to source and drain with the lowest possible resistance, which has hitherto only been possible with the aid of complex trench technology with subsequent filling.

To summarize, therefore, in the case of vertical structures the drift path is very difficult to produce, while in the case of lateral structures the terminals for source and drain present considerable problems. Particularly in view of these problems, compensation components have hitherto only been produced on a large scale with a vertical structure.

German Published, Non-Prosecuted Patent Application DE 100 26 924 A1, corresponding to U.S. Pat. No. 6,465,869 to Ahlers et al., has disclosed a compensation component with a lateral structure of the type discussed in the introduction. This compensation component is fabricated by introducing a trench into a semiconductor body by an anisotropic etchant, then providing the bottom surface and the side walls of the trench with alternating p-conducting and n-conducting layers, then removing the layers that have been applied to the surface of the semiconductor body in the process using a planarization step and finally filling the trench that remains with an insulating material or silicon on top of the layers. These numerous process steps are complex and difficult to implement.

SUMMARY OF THE INVENTION

It is accordingly an object of the invention to provide a compensation component and method for fabricating the component that overcome the hereinafore-mentioned disadvantages of the heretofore-known devices and methods of this general type and that—although it is configured as a lateral structure—can easily be connected to source and drain and can, nevertheless, be fabricated without major difficulty.

With the foregoing and other objects in view, there is provided, in accordance with the invention, a compensation component, including a semiconductor body having a surface, two active zones, a drift path disposed between the two active zones, and a stacked layer sequence made up of regions of first and second conduction types, the regions having a lateral section with at least one end and at least one inclined section leading toward the surface of the semiconductor body and adjoining the end of the lateral section, the lateral section and the at least one inclined section being completely embedded in the semiconductor body.

The component can be achieved by virtue of the fact that the lateral section and the at least one inclined section are embedded in the semiconductor body.

With the objects of the invention in view, there is also provided a method for fabricating the compensation component according to claim 1, including the steps of providing a semiconductor body having a surface, two active zones, a drift path disposed between the two active zones, and a stacked layer sequence made up of regions of first and second conduction types, the regions having a lateral section with at least one end and at least one inclined section leading toward the surface of the semiconductor body and adjoining the end of the lateral section, the lateral section and the at least one inclined section being completely embedded in the semiconductor body, and fabricating at least one of regions of the first conduction type and regions of the second conduction type of the lateral section and of the inclined section of the drift path by ion implantation with a mask having inclined edges.

In accordance with another feature of the invention, the lateral section has two ends and an inclined section is disposed at each of the two ends.

In accordance with a further feature of the invention, the regions of the first conduction type are connected, at an end of the lateral section opposite the end adjoining the one inclined section, to a region of the first conduction type introduced at a low level as one of the two active zones.

In accordance with an added feature of the invention, the region introduced at the low level is a drain zone.

In accordance with an additional feature of the invention, there is provided a terminal, the semiconductor body having at least two gate electrodes combined by a connection and commonly connected to the terminal.

In accordance with yet another feature of the invention, only regions of one of the first and second conduction types are introduced into a region of another of the first and second conduction types in the drift path and the other region is diffused to a low level.

The method according to the invention for fabricating the compensation component is distinguished by the fact that at least regions of the first conduction type and/or the other conduction type of the lateral section and/or of the at least one inclined section are fabricated by ion implantation step by a mask with inclined edges.

In accordance with yet a further feature of the invention, the compensation component may be a MOSFET, a JFET (junction-FED), an IGBT, a Schottky diode, or another semiconductor component.

In accordance with yet an added feature of the invention, the semiconductor body may be made from silicon, silicon carbide, a compound semiconductor, or another semiconductor material. It is also possible for the n-conduction type and the p-conduction type in each case to be swapped over, meaning that, for example, in the case of a MOSFET, the component may be an n-channel transistor or a p-channel transistor.

Furthermore, the invention can also readily be applied to integrated high-voltage semiconductor components, in which case a silicon-on-insulator (SOI) material can readily be employed for the semiconductor body.

If the invention is used for integrated high-voltage semiconductor components, it is possible for semiconductor components that are already present in the integrated circuit to be protected from the deposition of the implantation mask with the inclined edges by a thin protective layer, for example, of silicon nitride. After the implantation operation used to form the lateral section and the inclined section or inclined sections, it is, then, possible for the implantation mask to be removed by etching, with the protective layer serving as an etching stop, without the existing structures of the integrated circuit being adversely affected. Then, the protective layer is also removed.

In accordance with yet an additional mode of the invention, the regions of the second conduction type are introduced by diffusion of a common region, which has diffused to a low level, into the semiconductor body.

An important feature of the method according to the invention is that it makes it possible to avoid complex process steps. Instead of such process steps, multiple implantation steps with different energy levels are carried out, for example, in the case of a MOSFET, at least in the source region and in the gate region, through the mask having the inclined edges. Consequently, the regions produced by these implantation steps, in their depth in the semiconductor body, follow the inclined edges of the mask, with the implantation steps completely shielded in the thicker region of the mask. This allows both the depth of the n-conducting or p-conducting regions produced in this way and the dose level of these regions to be monitored and controlled very accurately. Moreover, the original surface quality of the semiconductor body is retained, so that—once again for the example of a MOSFET—the gate insulation layer, referred to as the gate oxide, can, likewise, be produced with a good quality. Finally, it is in this way possible for the drift path only to be doped at a late stage of the process sequence by the implantation steps involved in the fabrication of the semiconductor component so that it is, then, substantially only necessary to anneal the implantation damage and to activate the doping, but not to effect any great diffusion of the dopants. In this context it is even possible for the source, gate, and drain structures, with the exception of the metallization, to be virtually completed prior to the high-energy implantation step carried out to produce the drift path and for these structures to be protected by the thick regions of the mask during the high-energy implantation step. If the invention is applied to a high-voltage semiconductor component in an integrated circuit, it is possible for other structures of this component, such as, for example, bipolar transistors, resistors, etc., to be formed prior to the high-energy implantation for generating the drift path. The protective layer that can be used in this context has already been described above.

As has already been explained above, to carry out the method according to the invention, a thick implantation mask with inclined edges that reproduce the form of the doping regions produced during implantation, is of crucial importance. This implantation mask can readily be fabricated as set forth in the following text.

In accordance with again another mode of the invention, the mask is fabricated by applying an insulation layer is applied to the semiconductor body, carrying out a damage implantation step in a surface region of the insulation layer, applying a photoresist layer to the insulation layer, and exposing and developing the photoresist layer, and wet etching the insulation layer masked by the photoresist layer. The insulation layer can be densified before carrying out the damage implantation step.

First of all, a silicon dioxide layer is applied by deposition to a semiconductor body, which may also be a SOI structure, and densified if necessary. This is, then, followed by damage implantation to obtain a higher etching rate at the surface of this silicon dioxide layer. Then, a photoresist layer is applied, exposed, and developed, the photoresist layer remaining in place with a slight overhang in those regions in which the implantation mask is also to remain in place. Finally, a masked wet etch of the silicon dioxide layer is carried out through the developed photoresist layer, forming the desired mask structure having the inclined edges.

In accordance with again a further mode of the invention, the active zones are introduced into the semiconductor body prior to the ion implantation step.

In accordance with again an added mode of the invention, the mask is applied to a protective layer located on the semiconductor body to permit the mask to be removed without adversely affecting existing structures.

In accordance with again an additional mode of the invention, the protective layer is applied on the semiconductor body as a silicon nitride protective layer.

As an alternative to a mask made from silicon dioxide, it is also possible to use a mask made from another material, for example, silicon nitride. The only crucial factor is that this mask have inclined edges that reproduce implantation regions of corresponding form in the semiconductor body, and that the mask blocks implantation in its thick part.

In the case of a MOSFET, for the drain terminal, the doping region of the drift path does not, itself, have to lead to the surface of the semiconductor body. Instead, these doping regions can be connected to an n-conducting region (for an n-channel transistor) or p-doped region (for a p-channel transistor) that has diffused to a correspondingly low level. In such a case, the mask for the high-energy implantation can remain open in the drain region as for the regions of the same conductivity in the drift path.

In accordance with still another feature of the invention, the stacked layer sequence is disposed in a mirror-image fashion with respect to at least one of the two active zones.

In accordance with still a further feature of the invention, it is also possible for a plurality of component structures in strip form to be provided next to one another by being in each case of mirrored configuration on the source or drain side, in the case of the example of a transistor.

Furthermore, it is possible for the doping regions in the drift path for one conduction type, for example, for the p-doping, to be introduced as a region that has diffused to a low level prior to the high-energy implantation step. In such a case, therefore, only the doping regions of one conduction type, in the present example the regions for the n-doping, are produced by the high-energy implantation step using the implantation mask with the inclined edge. These regions that have been introduced by ion implantation then divide the region that has diffused to a low level into a plurality of individual doping regions so that, overall, the desired structure of alternating doped layers is formed.

In accordance with a concomitant feature of the invention, boron can, advantageously, be used for the p-doping. The n-doping can be produced, for example, by phosphorus or arsenic or alternatively by proton irradiation and subsequent conditioning at a temperature of between 400 and 500° C.

Other features that are considered as characteristic for the invention are set forth in the appended claims.

Although the invention is illustrated and described herein as embodied in a compensation component and method for fabricating the component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

FIG. 2A is a cross-sectional view through a further exemplary embodiment of a MOSFET of FIGS. 3A to 3D according to the invention along section line A—A;

FIG. 2B is a cross-sectional view through a further exemplary embodiment of a MOSFET of FIGS. 3A to 3D according to the invention along section line B—B;

FIG. 3A is a plan view of the MOSFET according to the invention;

FIG. 3B is another plan view of the MOSFET of FIG. 3A;

FIG. 4B is a cross-sectional view of yet another exemplary embodiment of the semiconductor body according to the invention;

FIG. 4C is a cross-sectional view of a further exemplary embodiment of the semiconductor body according to the invention;

DESCRIPTION OF THE PREFERRED EMBODIMENT

Figure 2C:
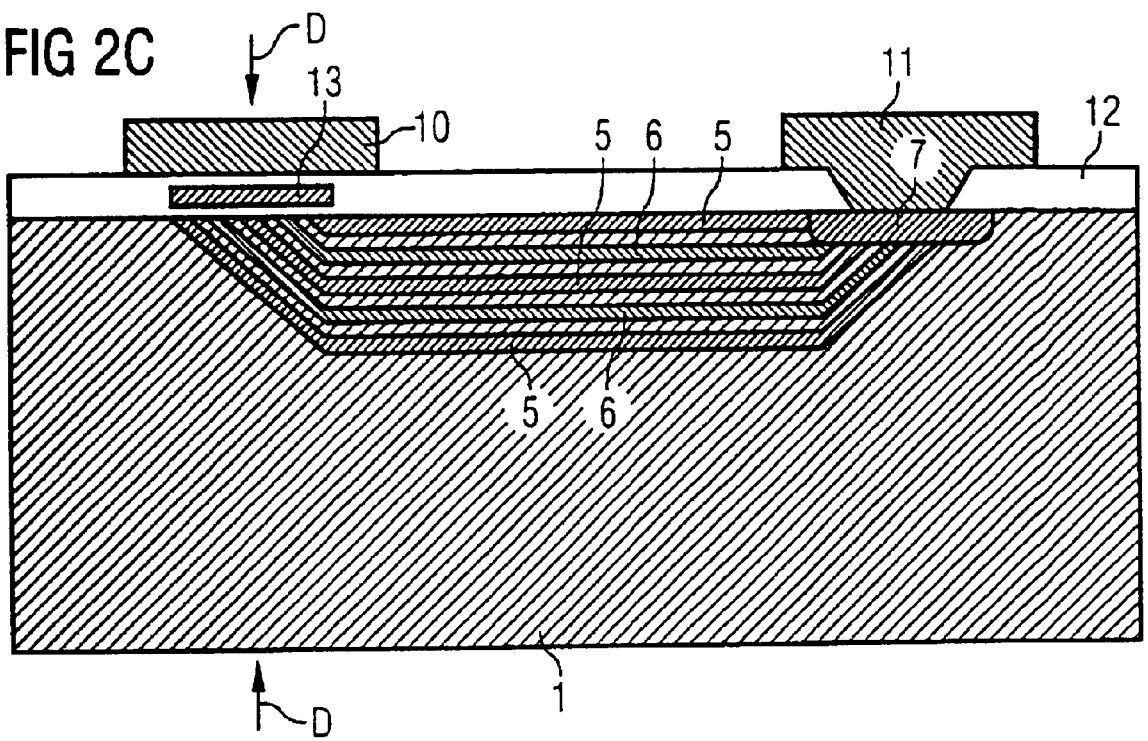
FIG. 2C is a cross-sectional view through a further exemplary embodiment of a MOSFET of FIGS. 3A to 3D according to the invention along section line C—C.
Figure 2D:
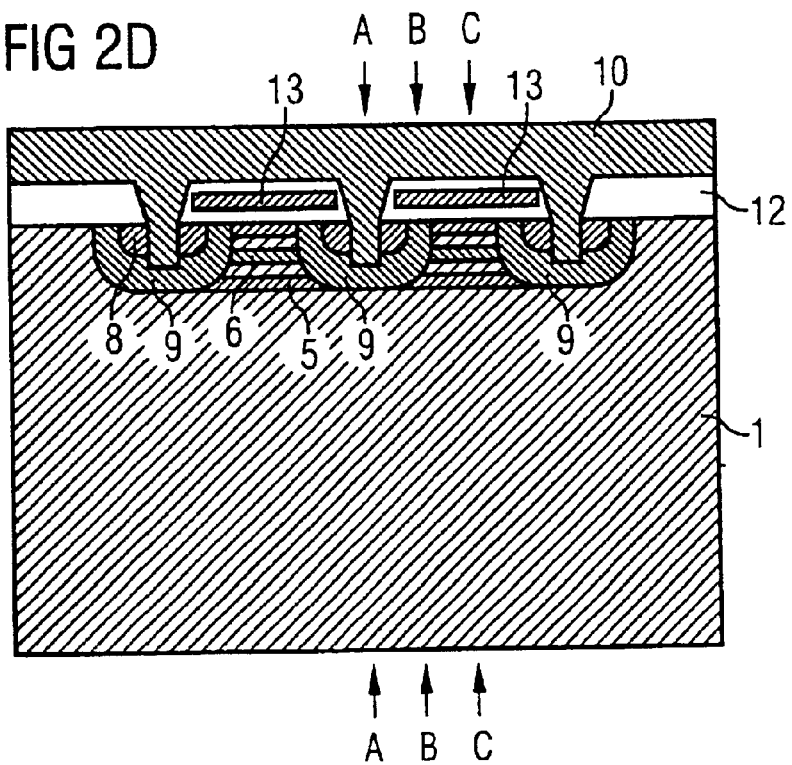
FIG. 2D is a cross-sectional view through a further exemplary embodiment of a MOSFET of FIGS. 3A to 3D according to the invention along section line D—D.

Referring now to the figures of the drawings in detail and first, particularly to FIGS. 3A and 3B thereof, there are shown positions of the cross-sections shown in FIGS. 2A to 2D indicated by the references A (through a source electrode for FIG. 2A), B (through a channel region for FIG. 2B), C (through the entire drift path for FIG. 2C) and D (perpendicular to the other cross-sections through gate and source region for FIG. 2D).

Figure 1A:
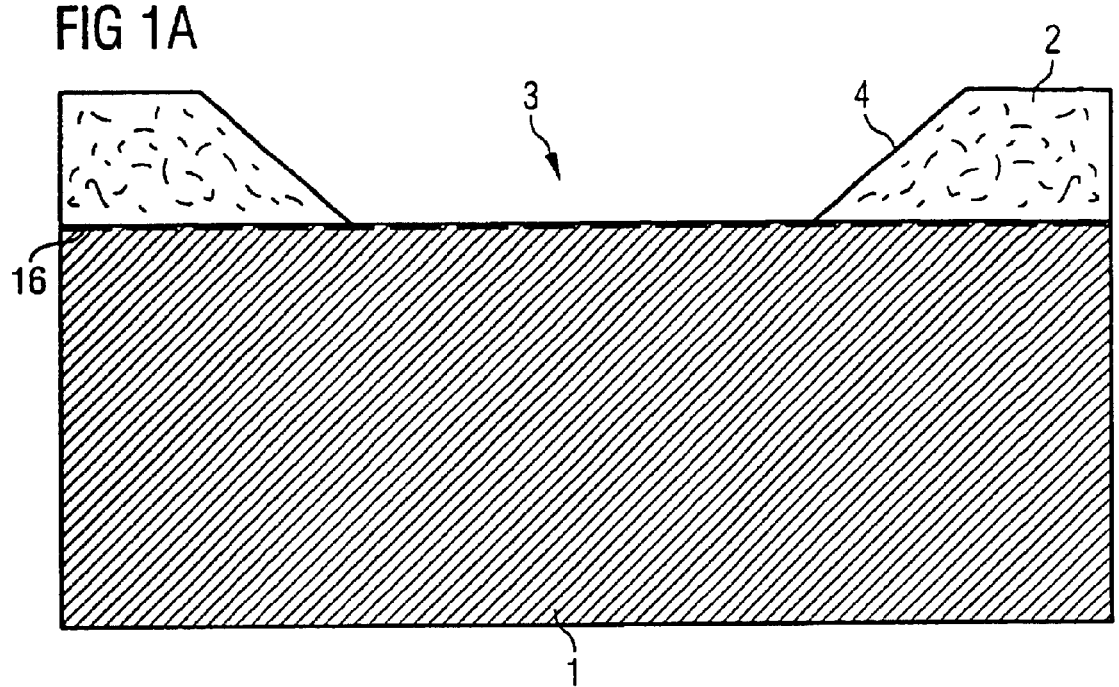
FIG. 1A is a cross-sectional view of an exemplary embodiment of a semiconductor body in a production step according to the invention.

FIG. 1A shows a semiconductor body 1 that may, for example, be a silicon substrate or an SOI structure. This semiconductor body 1 has a low level of n-doping or p-doping. An implantation mask 2 including, for example, silicon dioxide is provided on the semiconductor body 1. It is crucial for the implantation mask 2 to have inclined edges 4 in an opening 3 and to have a thickness that is such that it is able to shield off an implantation operation in its thick part.

If appropriate, it is also possible for a protective layer of, for example, silicon nitride, which does not adversely affect the implantation and allows the mask 2 to be subsequently removed again without existing structures being adversely affected, to be provided on the semiconductor body 1. This protective layer is indicated by a dashed line in 16.

A process for producing the implantation mask 2 has already been explained in the introduction. However, other production processes are also possible, provided that they give the inclined edges 4.

Figure 1B:
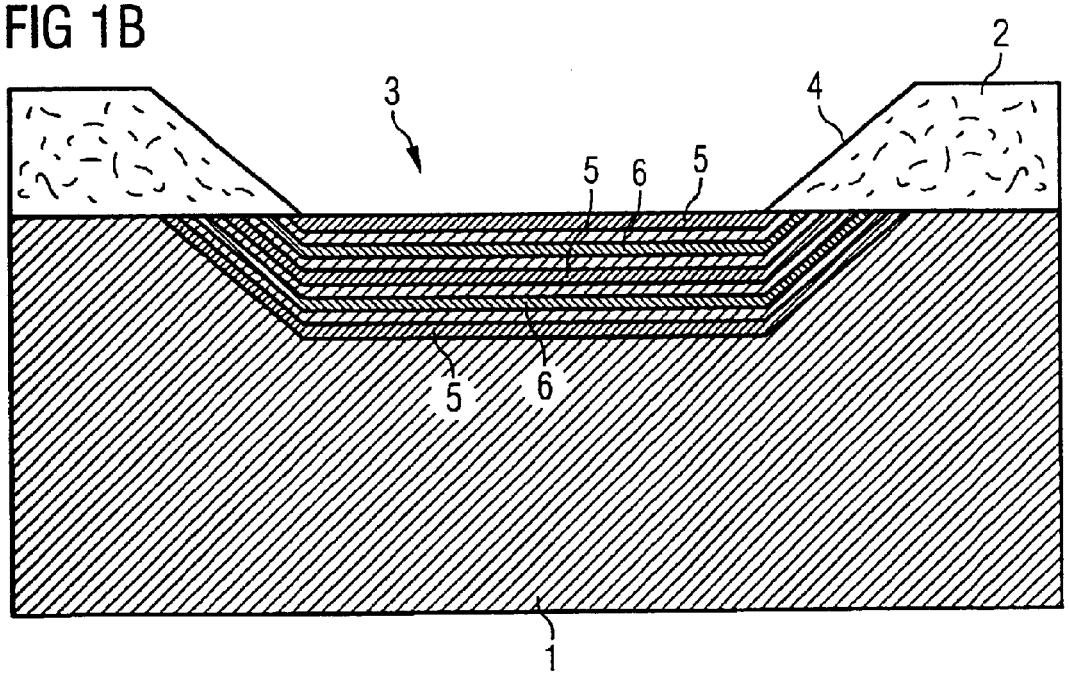
FIG. 1B is a cross-sectional view of an exemplary embodiment of a semiconductor body in another production step according to the invention.

FIG. 1B shows the configuration shown in FIG. 1A after a plurality of implantation steps have been carried out through the opening 3 in the mask 2 or through the mask 2 in the region of the inclined edges 4. For these implantation steps, boron is used for p-doping and phosphorus or arsenic or proton irradiation and subsequent conditioning at 400 to 500° C. for n-doping. By way of example, if the semiconductor body 1 is lightly n-doped, the implantation steps create p-doped regions 5 and n-doped regions 6. FIG. 1B clearly shows how the inclined edge 4 of the implantation mask 2 is reproduced in the profile of the regions 5 and 6. The regions 5 and 6 lying at a lower level are introduced into the semiconductor body 1 by the ion implantation steps with higher energies than the regions 5 and 6 located closer to the surface.

Figure 1C:
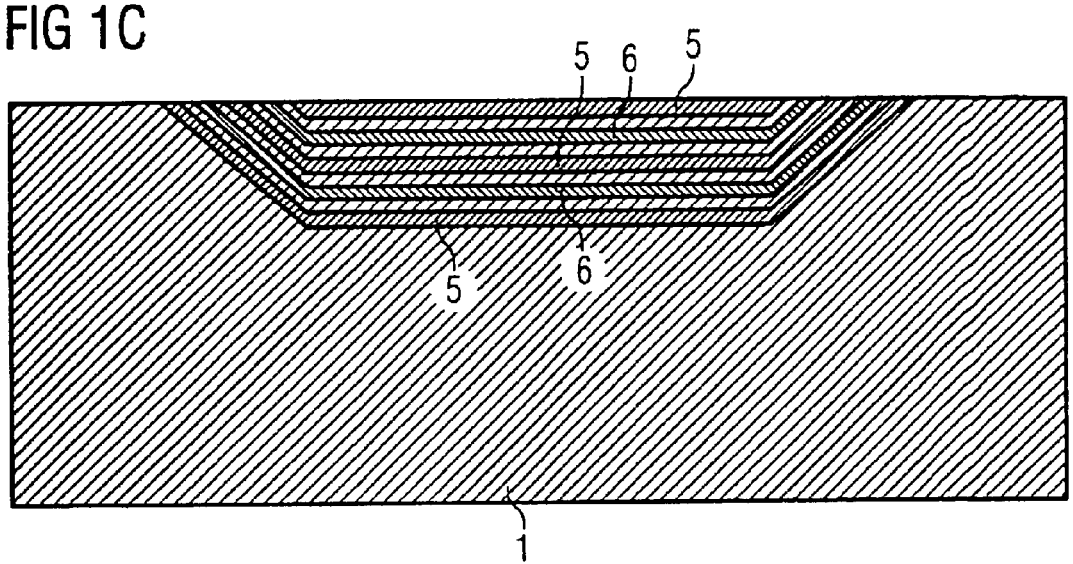
FIG. 1C is a cross-sectional view of an exemplary embodiment of a semiconductor body in a further production step according to the invention.

FIG. 1C illustrates the configuration shown in FIG. 1B after the implantation mask 2 has been removed. Thr removal step can be carried out using a suitable etchant, which removes the material of the implantation mask 2, i.e., in particular, silicon dioxide, but does not attack the semiconductor body 1 or its implantation regions.

Figure 1D:
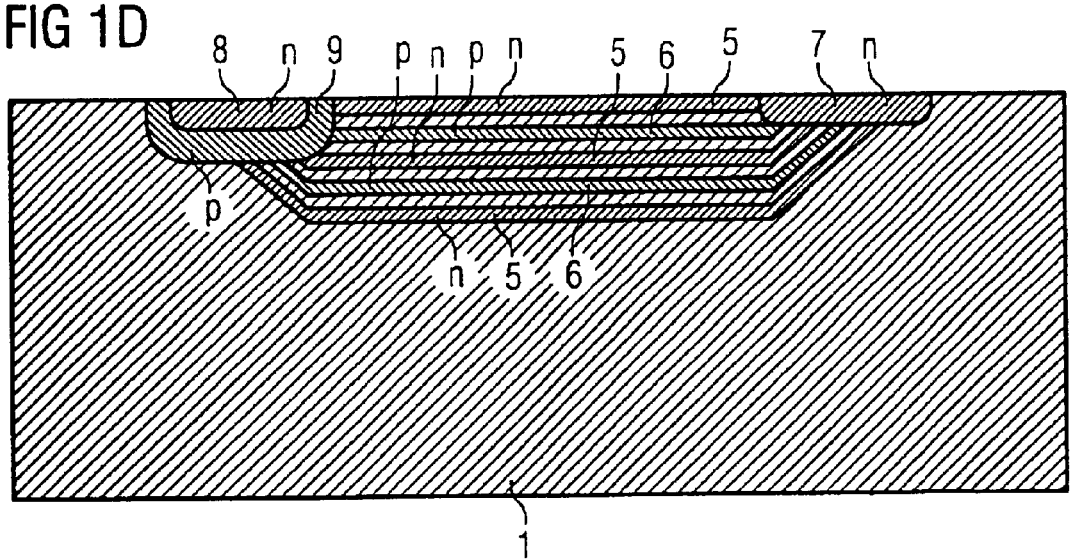
FIG. 1D is a cross-sectional view of an exemplary embodiment of a semiconductor body in yet another production step according to the invention.

Then, as shown in FIG. 1D, doping regions for an n-doped drain zone 7, a p-doped channel zone 9 and an n-doped source zone 8 are introduced in the usual way.

This may, therefore, involve diffusion or implantation with a subsequent heat treatment. In such a case, by way of example, first of all the channel zone 9 is diffused in, followed by a further diffusion step used to form the zones 7 and 8.

It should be expressly noted that the zones 7, 8, 9 may also have been produced prior to the regions 5, 6 being formed by implantation steps. In other words, in this case, the zones 7, 8, 9 are formed in the semiconductor body 1 first of all. Only then are the implantation steps with different energy levels carried out to produce the regions 5, 6.

FIGS. 2A to 2D and 3A to 3D show cross-sections (FIGS. 2A to 2D) through and plan views (FIGS. 3A to 3C) of a MOSFET as an exemplary embodiment of the semiconductor component according to the invention or of a MOSFET produced using the process according to the invention. In addition to the illustration presented in FIG. 1D, the MOSFET also has a source electrode 10, a drain electrode 11, an insulation layer 12 made, for example, from silicon dioxide and a gate electrode 13 made, in particular, from doped polycrystalline silicon.

To simplify the illustration, the plan views presented in FIGS. 3A and 3B only show the metallization for the source electrode 10 and the drain electrode 11 in the region of the contact holes. FIG. 3B also omits the gate electrode 13, in order to make the doping regions 5, 6 and parts of the zones 8 and 9 below visible.

Figure 3C:
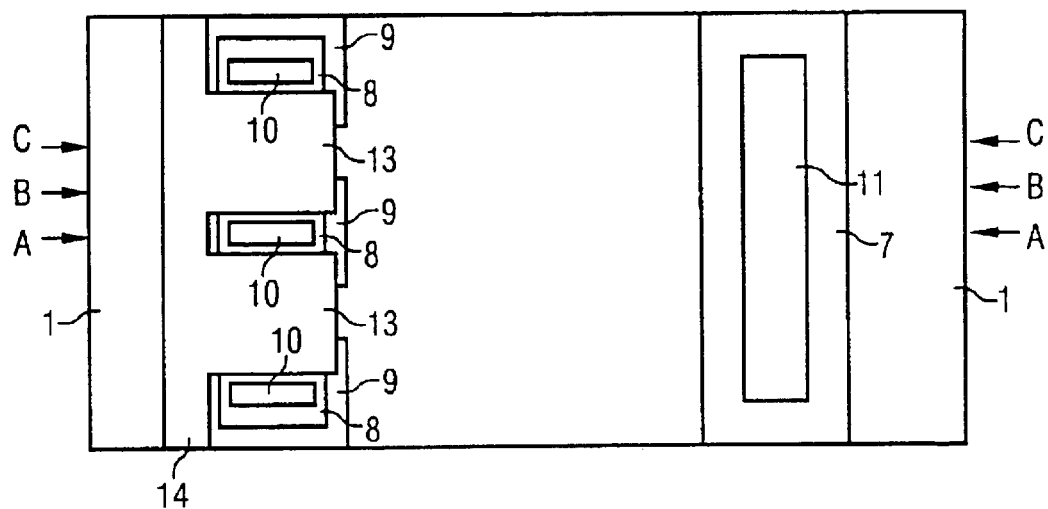
FIG. 3C is a plan view of a variant of the MOSFET embodiment shown in FIGS. 3A and 3B in which a plurality of gate electrodes are combined by a connection and lead to a common terminal.

FIG. 3C reveals how a plurality of gate electrodes 13 can be led to a common terminal 14. This common terminal 14, like the gate electrodes 13, may be of polycrystalline silicon. By way of example, aluminum can be used for the metallizations themselves, i.e., for the source electrode 10 and the drain electrode 11.

The doping regions 5, 6 of the drift path do not have to lead as far as the region of the surface of the semiconductor body 1 on both sides, as is illustrated in FIGS. 1A to 1D and 2A to 2D. Rather, these doping regions 5, 6 of the drift path may also be connected to a region that has diffused to a corresponding depth (for example, a drain zone 7' that has diffused to a deep level), as shown in the sectional illustration presented in FIG. 4A (corresponding to FIG. 2C but without source electrode 10). In an exemplary embodiment of this type, the implantation mask 2 for the high-energy implantation can remain open in the region of the drain electrode 11 in the same way as in the drift path (corresponding to opening 3). The inclined edge 4 of the implantation mask 2 is, in this case, only required in the region below the gate electrode 13 and/or in the region of the source electrode.

FIGS. 4B and 4C show exemplary embodiments in which a plurality of component structures in strip form with drift paths are disposed next to one another by virtue of them in each case being patterned in mirrored form on the source side (cf. FIG. 4B) or on the drain side (cf. FIG. 4C). In this way, the exemplary embodiment shown in FIG. 4B gives a common gate electrode 13', while the exemplary embodiment shown in FIG. 4C has a common drain electrode 11' for each of the two mirror-symmetrical structures. Of course, the regions of the drain zones 7' that have in each case diffused to a low level in both exemplary embodiments shown in FIGS. 4B and 4C may of course be replaced with drain zones 7 corresponding to the exemplary embodiment shown in FIG. 2 so that the drift path has a section that is inclined toward the surface adjoining the lateral section on both sides.

Figure 5A:
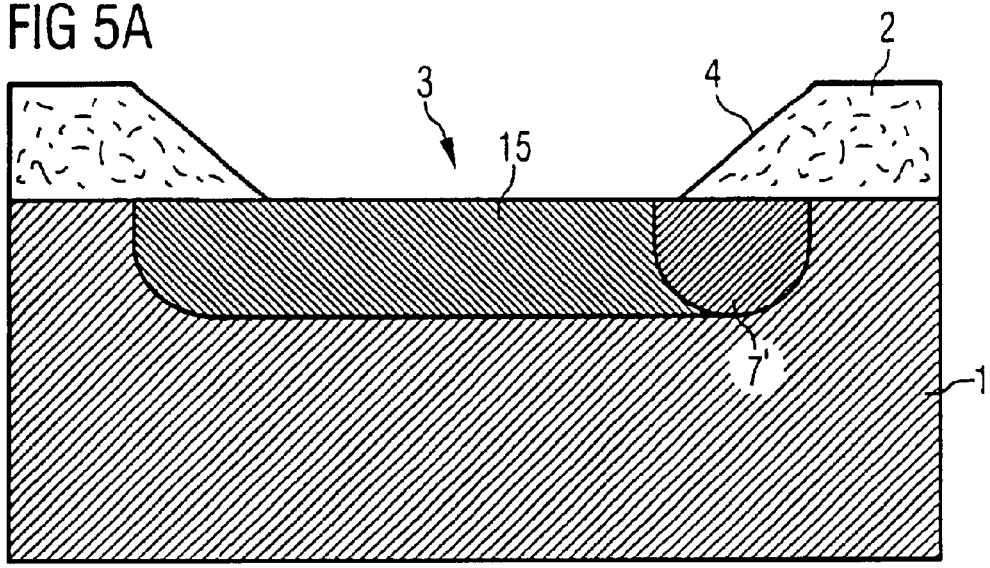
FIG. 5A is a cross-sectional view of yet a further exemplary embodiment of the semiconductor body according to the invention in a production step.
Figure 5B:
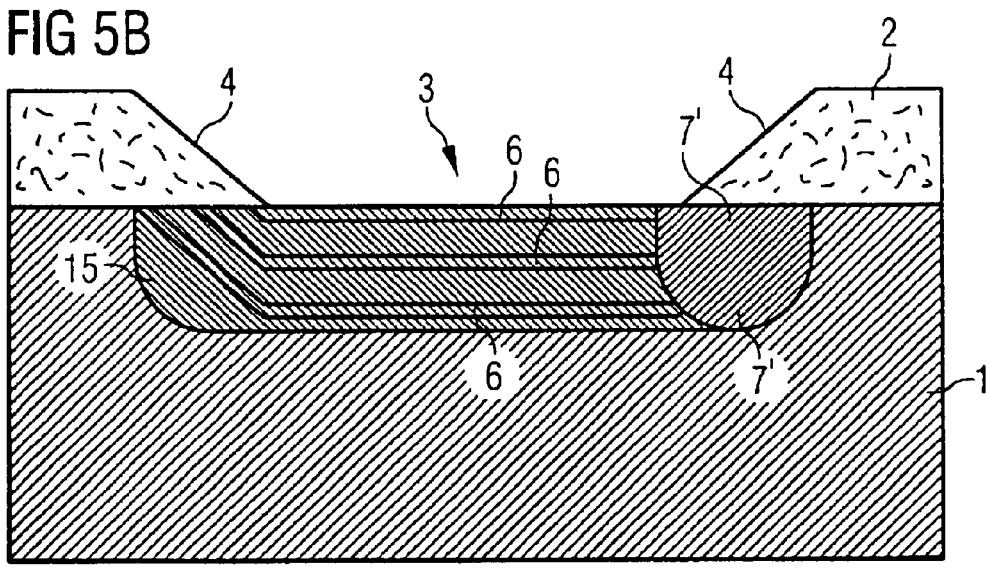
FIG. 5B is a cross-sectional view of the semiconductor body of FIG. 5A in another production step.
Figure 5C:
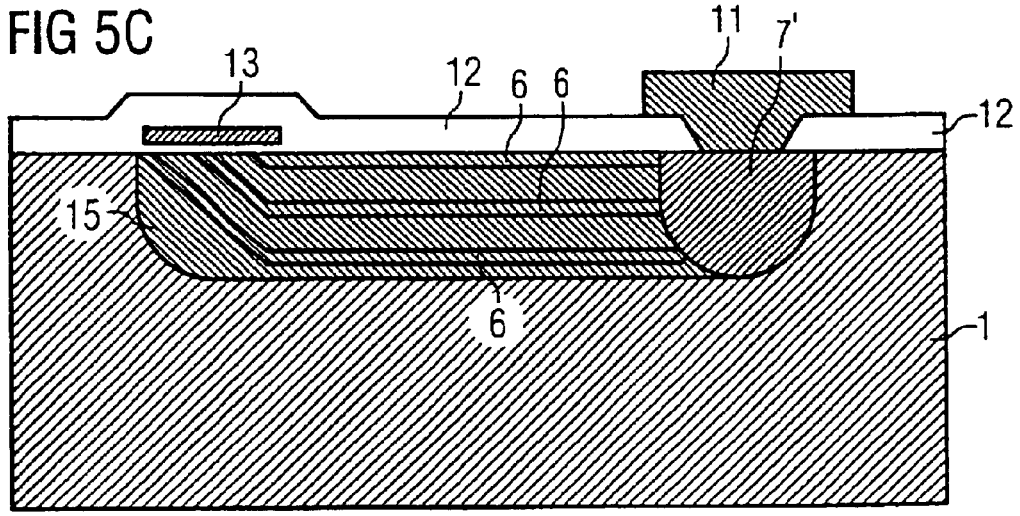
FIG. 5C is a cross-sectional view of the semiconductor body of FIG. 5A in yet another production step.

FIGS. 5A to 5C show a further exemplary embodiment of the method according to the invention.

In the exemplary embodiment of FIGS. 5A to 5C, prior to the high-energy implantation through the implantation mask 2 with the inclined edges 4 and the opening 3 into the, for example, n-doped semiconductor body 1, a p-conducting region 15 that has diffused to a low level is introduced into the semiconductor body 1 even before fabrication of the drain zone 7', which has, likewise, diffused to a low level, and before application of the implantation mask 2. After the implantation mask 2 has been produced, the structure shown in FIG. 5A is then present.

Then, only the doping regions of the conduction type that is opposite to the conduction type of the region 15, in the present case, therefore, the n-doped regions 6, are introduced through the implantation mask 2 by high-energy implantation. These regions 6, then, divide the region 15 that has diffused to a low level into various areas, as shown in FIG. 5B. On account of the inclined edge 4, the regions 6 have a lateral section in the region of the opening 3 and a section that is inclined toward the surface in the region of the edge 4. The same is also true of the areas of the region 15 that has diffused to a low level that have been divided up by these regions 6.

Figure 4A:
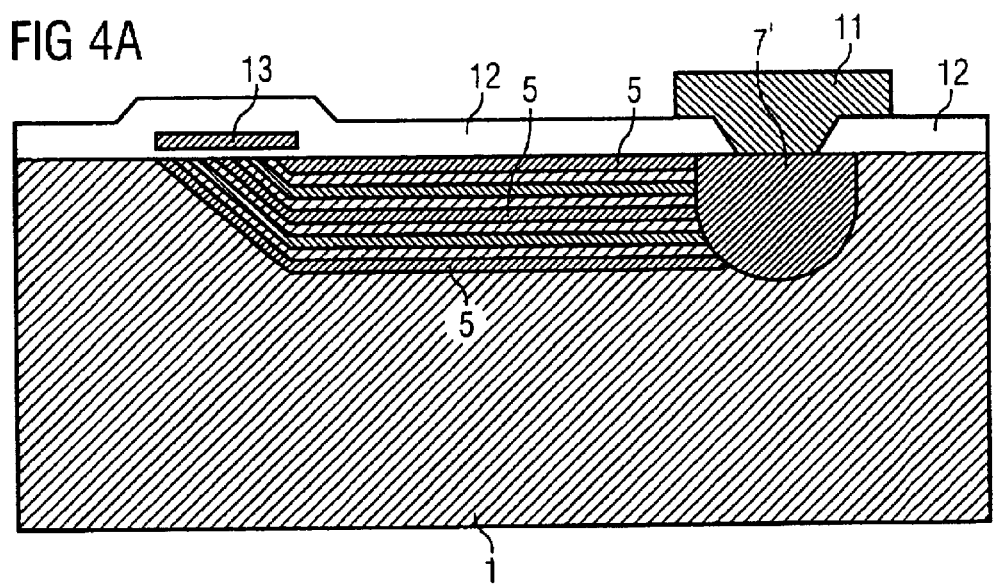
FIG. 4A is a cross-sectional view of another exemplary embodiment of the semiconductor body according to the invention.

Finally, FIG. 5C illustrates the finished semiconductor component having the drain electrode 11 and the gate electrode 13 (corresponding to FIG. 4A).

It is, therefore, crucial for the present invention that the drift path have a lateral section and at least one section that is inclined toward the surface, in each case including the regions 5, 6. These two sections are, in this case, completely embedded in the semiconductor body 1 and are not—as in the prior art—led around the edge of a trench.

I claim:

1. A compensation component, comprising:
   a semiconductor body having:
      a surface;
      two active zones;
      a drift path disposed between said two active zones; and a stacked layer sequence made up of regions of first and second conduction types, said regions having:
  a lateral section with at least one end; and
  at least one inclined section leading toward said surface of said semiconductor body and adjoining said end of said lateral section, said lateral section and said at least one inclined section being completely embedded in said semiconductor body.

2. The compensation component according to claim 1, wherein:
  said lateral section has two ends; and
  an inclined section is disposed at each of said two ends.

3. The compensation component according to claim 1, wherein said regions of said first conduction type are connected, at an end of said lateral section opposite said end adjoining said one inclined section, to a region of said first conduction type introduced at a low level as one of said two active zones.

4. The compensation component according to claim 3, wherein said region introduced at said low level is a drain zone.

5. The compensation component according to claim 1, wherein said stacked layer sequence is disposed in a mirror-image fashion with respect to at least one of said two active zones.

6. The compensation component according to claim 1, wherein at least one of said regions of said first conduction type is a proton irradiated region doped with at least one of the group consisting of a doping, phosphorus, and arsenic.

7. The compensation component according to claim 6, wherein at least one of said regions of said second conduction type is a boron-doped region.

8. The compensation component according to claim 1, wherein at least one of said regions of said second conduction type is a boron-doped region.

9. The compensation component according to claim 1, further comprising an SOI structure, said semiconductor body being disposed in said SOI structure.

10. The compensation component according to claim 1, wherein said semiconductor body is one of the group consisting of a MOSFET, a JFET, an IGBT, and a Schottky diode.

11. The compensation component according to claim 10, further comprising a terminal, said semiconductor body having at least two gate electrodes combined by a connection and commonly connected to said terminal.

12. The compensation component according to claim 1, wherein:
  only regions of one of said first and second conduction types are introduced into a region of another of said first and second conduction types in said drift path; and
  said other region is diffused to a low level.

13. The compensation component according to claim 1, wherein at least one of said regions of said first conduction type and said regions of said second conduction type of said lateral section and of said inclined section of said drift path are ion implanted with a mask having inclined edges.

14. The compensation component according to claim 1, wherein at least one of said regions of said first conduction type and said regions of said second conduction type of said lateral section and of said inclined section of said drift path are inclined-edged-masked ion implanted.

* * * * *